(12) United States Patent
Bentell et al.

(10) Patent No.: US 6,518,080 B2
(45) Date of Patent: Feb. 11, 2003

(54) METHOD OF FABRICATING LOW DARK CURRENT PHOTODIODE ARRAYS

(75) Inventors: Jonas Bentell, Hamilton Square, NJ (US); Michael Lange, Yaidley, PA (US)

(73) Assignee: Sensors Unlimited, Inc., Princeton, NJ (US)

( * ) Notice: Subject to any disclaimer, the term of this patent is extended or adjusted under 35 U.S.C. 154(b) by 0 days.

(21) Appl. No.: 09/992,965

(22) Filed: Nov. 14, 2001

(65) Prior Publication Data

US 2002/0192848 A1 Dec. 19, 2002

Related U.S. Application Data

(60) Provisional application No. 60/299,318, filed on Jun. 19, 2001.

(51) Int. Cl.[7] .............................................. H01L 21/00
(52) U.S. Cl. .............................. 438/34; 438/45; 438/94
(58) Field of Search ............................ 438/34, 45, 46, 438/47, 57, 93, 94, 237

(56) References Cited

U.S. PATENT DOCUMENTS

| | | | |
|---|---|---|---|
| 4,242,695 A | 12/1980 | Ouchi et al. | 357/30 |
| 4,639,999 A | * 2/1987 | Daniele | 438/34 |
| 4,686,761 A | * 8/1987 | Hacskaylo | 438/94 |
| 4,906,583 A | * 3/1990 | Kagawa et al. | 438/94 |
| 5,877,068 A | 3/1999 | Yallup | 438/404 |
| 5,936,268 A | 8/1999 | Cockrum et al | 257/188 |
| 6,081,000 A | * 6/2000 | Lell | 438/34 |
| 6,104,074 A | 8/2000 | Chen | 257/453 |
| 6,133,615 A | 10/2000 | Guckel et al. | 257/456 |
| 6,136,628 A | 10/2000 | Sugiyama | 438/48 |
| 6,147,349 A | 11/2000 | Ray | 250/338.4 |
| 6,160,282 A | 12/2000 | Merrill | 257/292 |
| 6,232,626 B1 | 5/2001 | Rhodes | 257/292 |
| 6,255,709 B1 | 7/2001 | Marso et al. | 257/462 |
| 6,262,465 B1 | 7/2001 | Williamson et al. | 257/458 |

* cited by examiner

*Primary Examiner*—Chandra Chaudhari
(74) *Attorney, Agent, or Firm*—Wolff & Samson

(57) ABSTRACT

A method of fabricating low dark current photodiodes is provided. A multi-layer epitaxial structure is provided, wherein a contact epilayer forms the top-most layer of the structure. A diffusion mask is deposited on top of the contact layer, and at least one hole formed therein. Dopant is diffused through the hole and into both the contact epilayer and the underlying epitaxial structure, forming a doped region. A contact mask is then deposited, covering both the diffusion mask and the holes formed therein. The contact mask and contact epilayer are selectively etched, forming contact mesas and exposing portions of the underlying layers. A passivation coating, also serving as an anti-reflective coating and having uniform thickness, is deposited on top of the contact mesa and the exposed portions. Contacts and bond pads are then deposited, forming a complete photodiode.

22 Claims, 5 Drawing Sheets

METHOD OF FABRICATING LOW DARK CURRENT PHOTODIODE ARRAYS

RELATED APPLICATIONS

This application claims the priority of Provisional Patent Application Ser. No. 60/299,318, filed Jun. 19, 2001, the entire disclosure of which is expressly incorporated herein by reference.

BACKGROUND OF THE INVENTION

1. Field of the Invention

The present invention relates to a method of fabricating photodiode arrays. More specifically, the invention relates to a method of fabricating photodiode arrays with non-alloyed contacts and uniform responsivity by selectively etching a contact epilayer prior to passivation of the photodiode array.

2. Related Art

Low dark current photodiode arrays are extremely useful in the opto-electronic industry. Such arrays can be employed in applications including fiber-optic networking, spectral power monitoring, and spatial positioning sensors. Conventional methods of fabricating such arrays, however, suffer from significant shortcomings.

According to such conventional fabrication methods, diffusion processes are typically used to form diode ("p-n") junctions by introducing a dopant into a semiconductor substrate by passing the dopant though a combined dielectric passivation and diffusion mask. Such masks also serve to passivate the semiconductor surface areas that intersect the p-n junctions. After diffusion, the surface areas are again covered with a new passivation layer that also serves as an antireflective ("AR") coating.

The process of removing initial passivation coatings after the dopant has been diffused, and re-passivating the semiconductor with dielectric coatings, increases dark current in the semiconductor, thereby significantly reducing efficiency. Further, the dielectric coatings often have non-uniform thicknesses, resulting in non-uniform dispersion of light reflected off of the semiconductor and causing interference and reduced efficiency when the semiconductor is used in spectral monitoring applications. Additionally, the initial passivation coatings are frequently applied to semiconductor surfaces that are not fresh; prior to initial passivation, the semiconductor surface is often given ample time to undergo microscopic reconstruction due to the exchange of surface matter with gases in the surrounding atmosphere. Even further, contacts placed on the semiconductor surface often are not optimally arranged, thus requiring the application of alloyed contacts to reduce electrical yield per contact area. Finally, when non-gaseous dopant sources are used in conventional diffusion processes, additional cleaning processes that damage the combined passivation/diffusion mask must be used, thereby making the surface difficult to re-passivate and ultimately degrading the quality of the resulting photodiode array.

These and other shortcomings of conventional photodiode array fabrication methodologies are solved by the present invention, described below in further detail.

OBJECTS AND SUMMARY OF THE INVENTION

It is an object of the present invention to provide a method of fabricating low dark current photodiode arrays.

It is a further object of the present invention to provide a method of fabricating low dark current photodiode arrays with non-alloyed contacts and uniform responsivity.

It is another object of the present invention to provide a method of fabricating low dark current photodiode arrays by selectively etching a contact epilayer prior to passivation of the semiconductor.

It is an additional object of the present invention to provide a semiconductor having passivation and AR coating thicknesses that are uniform throughout the entire surface area of the semiconductor.

It is a further object of the present invention to provide a method of fabricating low dark current photodiodes wherein the semiconductor surface is protected by an epitaxial layer prior to passivation.

It is an additional object of the present invention to provide a method of fabricating low dark current photodiodes having contact epilayers that provide low series resistance and contribute to high array resolution.

It is another object of the present invention to provide a photodiode array wherein, prior to passivation, the contact epilayer protects the semiconductor surface from non-gaseous dopant sources.

The present invention relates to a method for fabricating low dark current semiconductor photodiode arrays having non-alloyed contacts and uniform responsivity by selective etching of a contact epilayer prior to passivation of the semiconductor. A semiconductor having doped layers is first provided. A contact layer is deposited on the semiconductor, and a diffusion mask is deposited on the contact layer. Holes are opened in the diffusion mask, and dopant is diffused therethrough, into both the contact layer and the semiconductor. A new etch mask is deposited and etched. The contact layer is then selectively etched so that only islands remain where contacts are to be deposited. The semiconductor is passivated with a uniform single- or multi-layer coating, which may also serve as an anti-reflective (AR) coating. Metal contacts and bond pads are deposited, thereby formulating a complete, low dark current semiconductor photodiode array.

The method of the invention can be altered to allow for deposition of metal contacts prior to partial etch removal of the contact epilayer, thereby allowing the metal contacts to serve as an etch mask. If the contact metal is capable of being used as a bond pad metal, both the contact metal and the bond pad metal can be deposited in the same pass.

BRIEF DESCRIPTION OF THE DRAWINGS

Other important objects and features of the invention will be apparent from the following Detailed Description of the Invention, taken in connection with the accompanying drawings, in which.

DETAILED DESCRIPTION OF THE INVENTION

The present invention relates to a method of fabricating low dark current photodiode arrays. A multi-layer epitaxial structure having a contact epilayer is provided, wherein the contact epilayer forms the top-most layer. A diffusion mask is deposited on the contact epilayer, holes are formed therein, and dopant is diffused through the holes and into the contact epilayer and underlying epitaxial structure. A contact mask is formed and etched, along with portions of the contact epilayer, to form contact mesas. A passivation coating of uniform thickness is applied, and contacts and bond pads are deposited.

Figure 1:
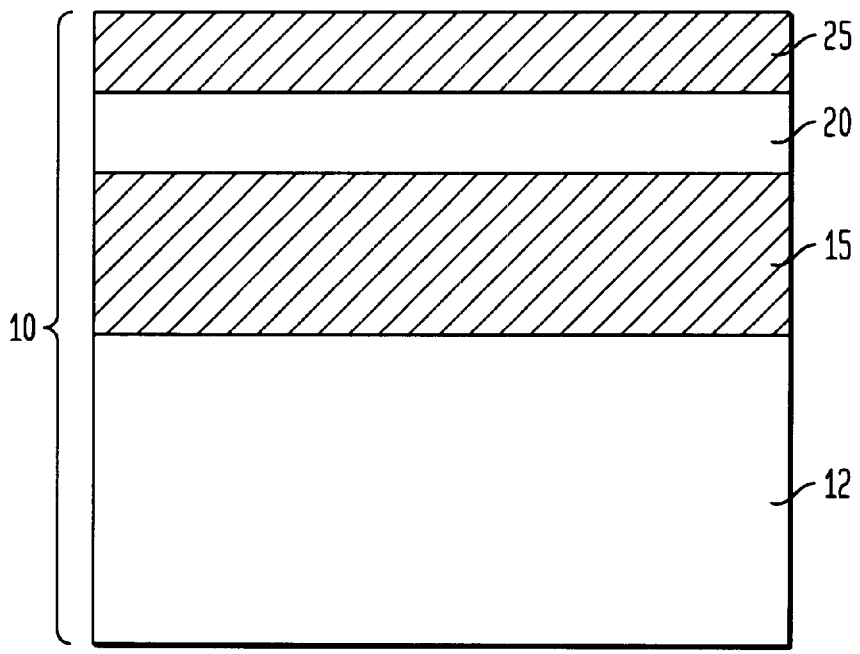
FIG. 1 is a cross-sectional view of the initial epitaxial structure of the present invention.

FIG. 1 shows the starting epitaxial structure for fabricating a semiconductor photodiode. The epitaxial structure, generally indicated at 10, has multiple layers, including substrate 12, active layer 15, cap 20, and contact epilayer 25. In a preferred embodiment of the present invention, substrate 12 is formed of an InP material; active layer 15 is formed of an InGaAs material; cap 20 is formed of InP, and contact epilayer 25 is formed of an InGaAs material. Importantly, contact epilayer 25 is configured to be the top-most layer of epitaxial structure 5, and is preferably formed from a low series-resistance, InGaAs material that allows the easy deposition of contacts thereon. It is to be understood that substrate 12, active layer 15, cap 20, and contact epilayer 25 can be formed of other semiconductor materials known in the art. Also, contact epilayer 25 can be selectively etched, so that an easily passivable underlying layer is exposed.

Contact epilayer 25 provides a sacrificial layer that protects the underlying layer prior to passivation and during removal of diffusion mask 30. By limiting the amount of time that underlying layers are exposed to the atmosphere prior to passivation, contact epilayer 25 thereby ensures that the underlying layers will be fresh when passivation occurs. Such a feature greatly assists in achieving a high-integrity passivation layer having uniform thickness, thereby reducing low dark current in the photodiode. Contact epilayer 25 also allows for the formation of large contact areas on the semiconductor, thereby contributing to low series resistance and increasing the efficiency of the semiconductor. Additionally, large contact areas eliminate the need for depositing alloyed contacts on the semiconductor, since contact epilayer 25 increases overall conductivity of the photodiode.

Figure 2:
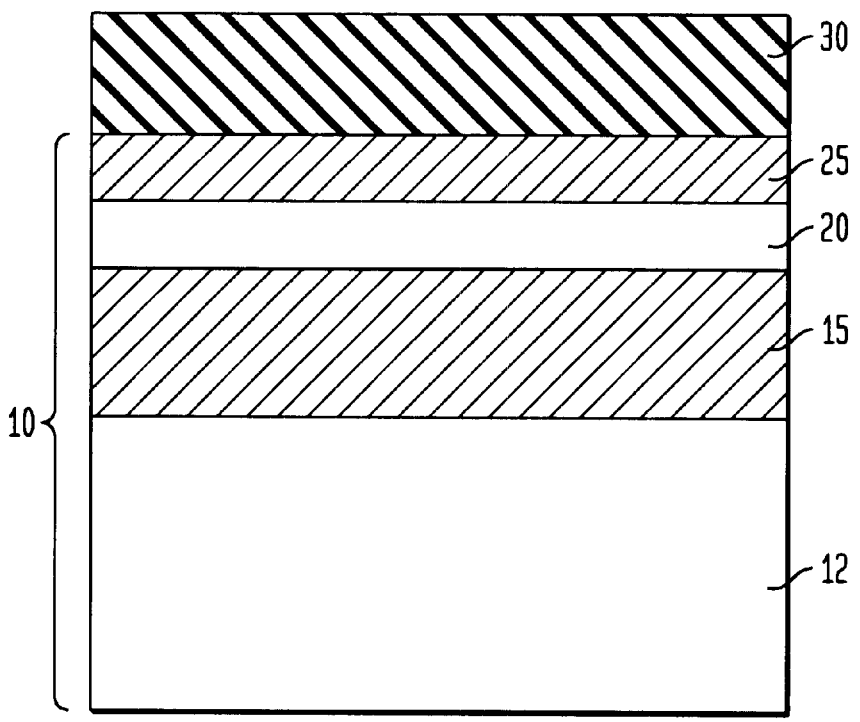
FIGS. 2–8 show the steps for fabricating a photodiode from the epitaxial structure shown in FIG. 1.

FIGS 2–8 show the processing steps according to the present invention for fabricating a photodiode. As shown in FIG. 2, diffusion mask 30 is deposited on top of contact epilayer 25, so that the entire surface of contact epilayer 25 is covered. In a preferred embodiment, diffusion mask 30 is formed of a silicon nitride compound, but any other mask known in the art can be used.

Figure 3:
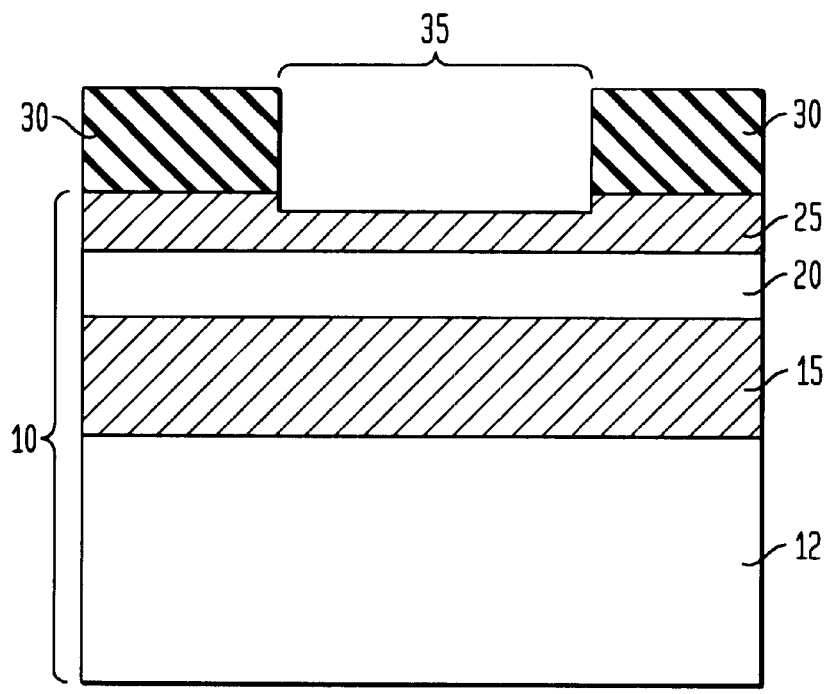

Next, as shown in FIG. 3, at least one hole 35 is opened in diffusion mask 30. The hole 35 can be opened by photolithography and etched as is known in the art. Advantageously, a plurality of holes 35 may be opened throughout diffusion mask 30 so as to form photodiode arrays having high diode densities and high resolution.

Figure 4:
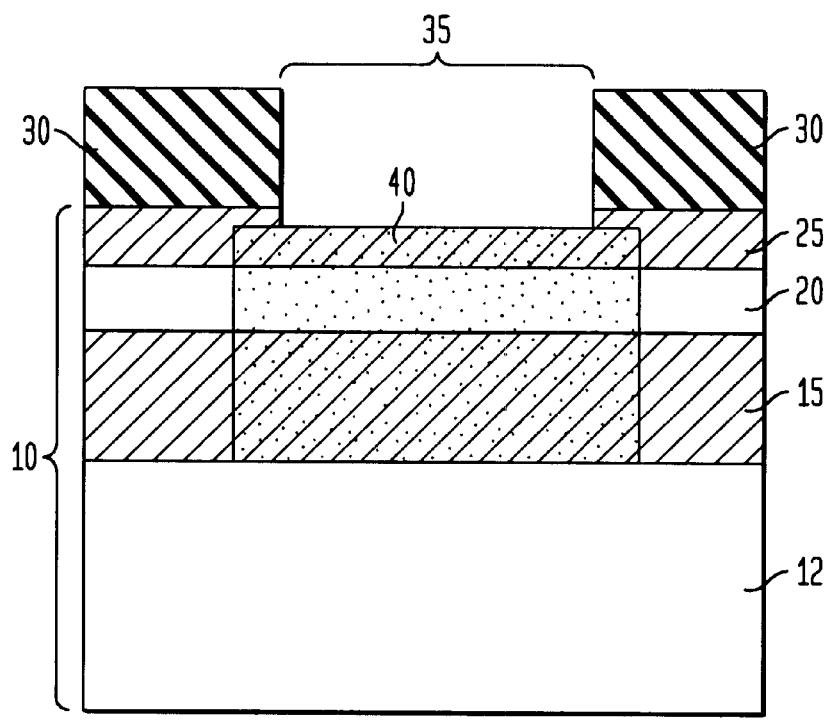

The next fabrication step is shown in FIG. 4, wherein dopant is diffused through the diffusion mask 30 via hole 35 and into contact epilayer 25, cap 20, and active layer 15, forming doped area 40. In a preferred embodiment of the invention, a p-type dopant is utilized to form a diode junction. It is to be understood that gaseous or non-gaseous dopants can be utilized to form said junctions. A substantial top portion of doped area 40 is left exposed through diffusion mask 30 via at least one hole 35.

Figure 5:
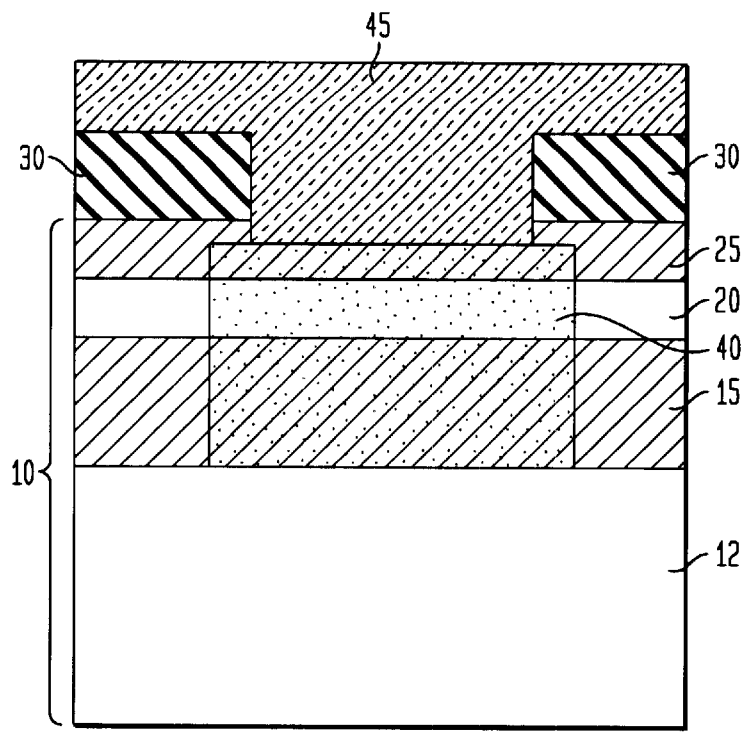

As shown in FIG. 5, after doped area 40 has been formed via diffusion of dopant through diffusion mask 30 and into contact epilayer 25, cap 20, and active layer 15, contact mask 45 is deposited on top of diffusion mask 30 and into hole 35 of FIG. 4, thereby covering the entire top surface of the photodiode. Contact mask 45 is preferably formulated from silicon nitride, but may be formulated from any material known in the art.

Figure 6:
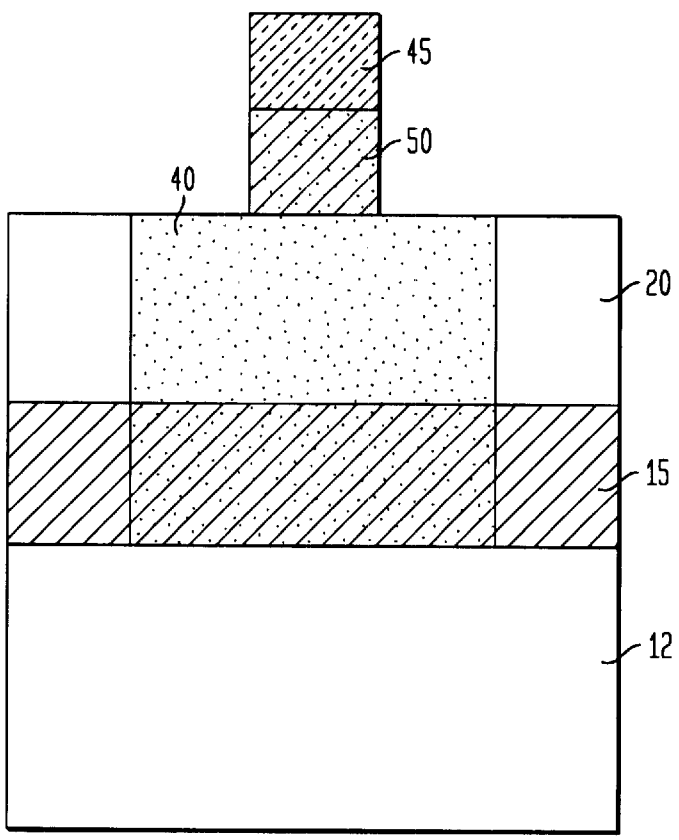

FIG. 6 shows the next steps of the fabrication process according to the present invention. Contact mask 45 is patterned using photolithography processes, and selectively etched so that only a small portion of contact mask 45 remains. Additionally, diffusion mask 30, shown in the FIGS. 2–5, is completely removed. Further, portions of contact epilayer 25 are selectively etched, so that only contact mesa 50 is left remaining. Thus, contact mask 45 is left covering contact mesa 50, while portions of doped area 40 are exposed.

Figure 7:
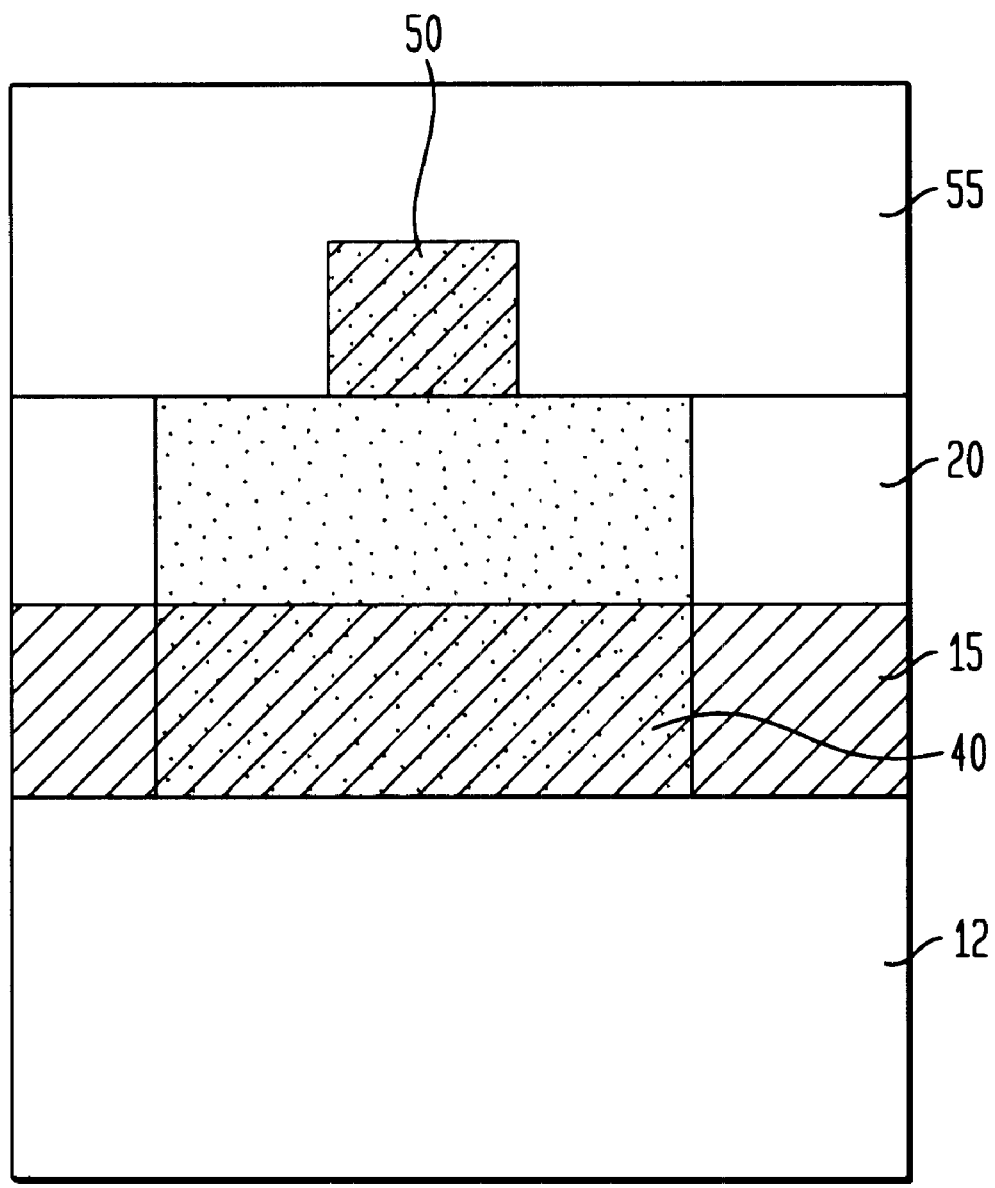

FIG. 7 shows the application of passivation coating 55 on top of cap 20, doped area 45, and contact mesa 50. Significantly, passivation coating 55 provides an antireflective (AR) coating that uniformly disperses reflected light away from the semiconductor. Thus, passivation coating 55 serves to decrease interference caused when reflected light is not uniformly dispersed, thereby increasing the efficiency of the photodiode. Advantageously, by not requiring more than one passivation step for the semiconductor, the present invention ensures that the fabricated photodiode will operate with low dark current. Further, in applications where the photodiode is used as a pixel source for a display, the uniform thickness of passivation coating 55 ensures that similar responsivity characteristics are achieved by all photodiodes in the display, thereby increasing resolution.

Figure 8:
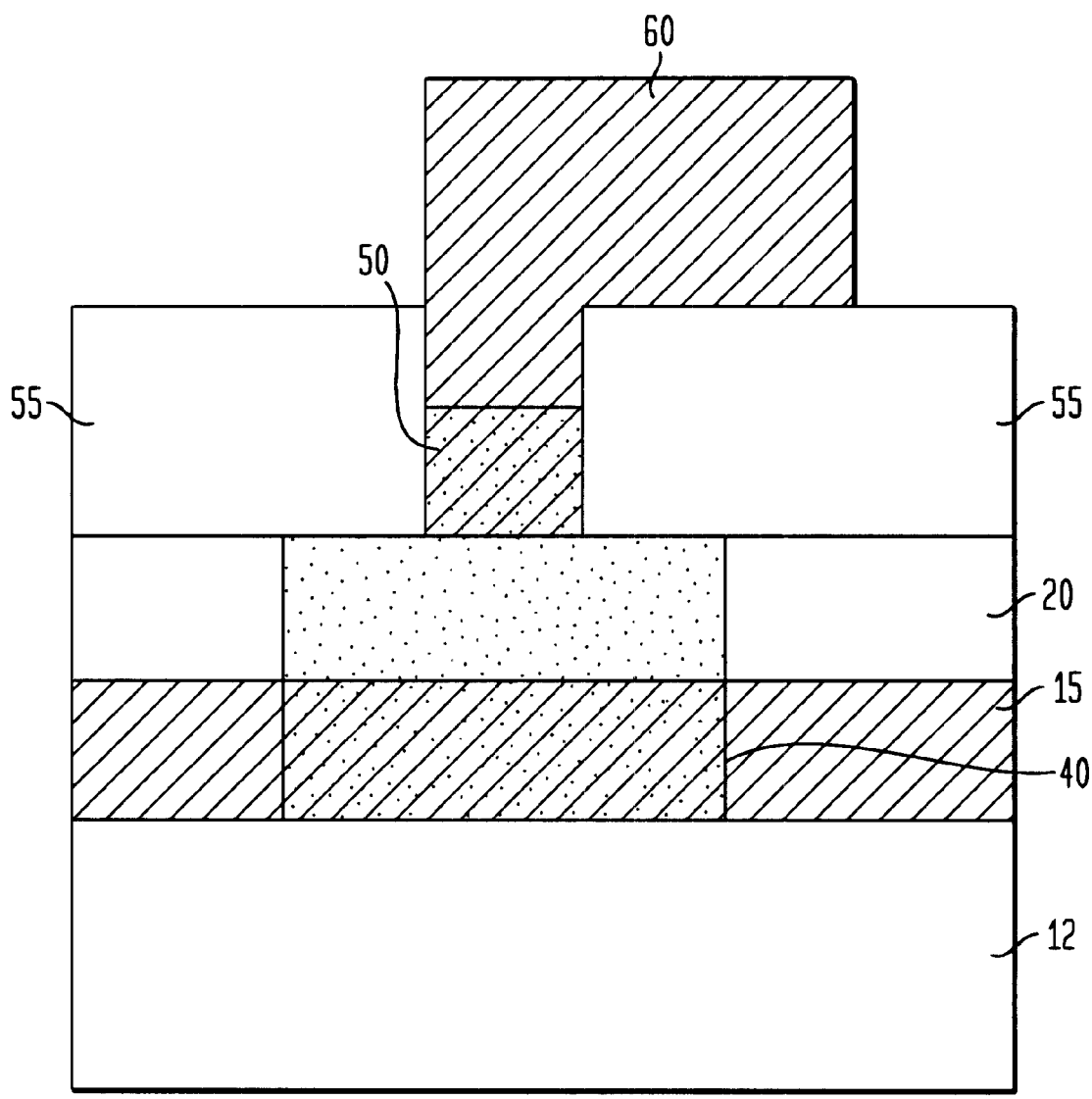

Finally, in FIG. 8, contact 60 is deposited through passivation coating 55 and forms electrical contact with contact mesa 50. Once contact 60 has been successfully deposited, the fabrication procedure is complete, and a functioning, low dark-current photodiode is formed. If contact 60 is comprised of a metal also capable of being used as a bond pad metal, both contact 60 and additional bond pads may be deposited on the semiconductor in a single pass.

Further, contact 60 can be deposited on the semiconductor prior to partial etch removal of contact epilayer 25, depicted in FIGS. 1–5. In this fashion, contact 60 can also function as a contact layer etch mask, thereby eliminating the need for contact mask 45, depicted in FIGS. 5–6.

In an embodiment of the present invention, the fabrication processes described above can be used to form a photodiode having Zinc-diffused "p" regions. Zinc-diffused "p" regions can be diffused into the layers of the present invention, and TiAu can be used to form both contacts and bond pads on the InGaAs photodiode in a single pass.

Having thus described the invention in detail, it is to be understood that the foregoing description is not intended to limit the spirit and scope thereof. What is desired to be protected by Letters Patent is set forth in the appended claims.

What is claimed is:

1. A method of fabricating a low dark current photodiode comprising:

providing an epitaxial structure;

depositing a contact epilayer on top of the epitaxial structure;

depositing a diffusion mask on top of the contact epilayer;

opening at least one hole in the diffusion mask;

diffusing dopant through the at least one hole and into, the contact epilayer, and the epitaxial structure;

depositing a contact mask on top of the diffusion mask and covering the at least one hole;

selectively etching the contact mask, the diffusion mask, and the contact epilayer so that at least one contact mesa is formed and an underlying surface is exposed;

applying a passivation coating on top of the contact mesa and the underlying surface; and depositing a contact through the passivation coating, a portion of the contact touching the contact mesa and another portion of the contact extending above the passivation coating.

2. The method of claim 1, wherein the epitaxial structure has multiple layers.

3. The method of claim 2, wherein an InP substrate forms the bottom layer of the multiple layers.

4. The method of claim 3, wherein an InGaAs active layer is deposited on top of the InP substrate.

5. The method of claim 4, wherein an InP or InAlAs cap is deposited on top of the InGaAs active layer.

6. The method of claim 5, wherein the contact layer is an InGaAs layer deposited on top of the InP cap.

7. The method of claim 1, wherein the contact layer has a low series resistance.

8. The method of claim 1, wherein the dopant is Zinc.

9. The method of claim 1, wherein the passivation coating is an anti-reflective coating.

10. The method of claim 1, wherein the passivation coating has a uniform thickness.

11. The method of claim 1, wherein the contact is formed of TiAu.

12. The method of claim 1, wherein the contact and a bond pad can be deposited in a single pass.

13. A method for fabricating a low dark current photo-diode comprising:

providing an multi-layer epitaxial structure having a contact epilayer as the top-most layer;

depositing a diffusion mask on top of the contact epilayer;

opening at least one hole in the diffusion mask;

diffusing dopant through the at least one hole and into the contact epilayer and the epitaxial structure;

depositing a contact on the diffusion mask, a portion of the contact extending through the at least one hole and touching the contact epilayer;

etching the diffusion mask and the contact epilayer so that at least one contact mesa is formed and an underlying surface is exposed; and applying a passivation coating on top of the contact mesa and the underlying surface, wherein a portion of the contact is left exposed above the passivation coating.

14. The method of claim 13, wherein an InP substrate forms the bottom layer of the multi-layer epitaxial structure.

15. The method of claim 14, wherein an InGaAs active layer is deposited on top of the InP substrate.

16. The method of claim 15, wherein an InP or InAlAs cap is deposited on top of the InGaAs active layer.

17. The method of claim 16, wherein the contact layer is an InGaAs layer deposited on top of the InP cap.

18. The method of claim 13, wherein the contact layer has a low series resistance.

19. The method of claim 13, wherein the dopant is Zinc.

20. The method of claim 13, wherein the passivation coating is an anti-reflective coating.

21. The method of claim 13, wherein the passivation coating has a uniform thickness.

22. The method of claim 13, wherein the contact is formed of TiAu.

* * * * *